United States Patent
Ararao et al.

(10) Patent No.: US 7,786,593 B2
(45) Date of Patent: *Aug. 31, 2010

(54) INTEGRATED CIRCUIT DIE WITH PEDESTAL

(75) Inventors: Virgil Cotoco Ararao, Shrewsbury, MA (US); Il Kwon Shim, Singapore (SG); Seng Guan Chow, Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 136 days.

This patent is subject to a terminal disclaimer.

(21) Appl. No.: 11/760,690

(22) Filed: Jun. 8, 2007

(65) Prior Publication Data

US 2007/0228538 A1 Oct. 4, 2007

Related U.S. Application Data

(63) Continuation of application No. 10/894,561, filed on Jul. 19, 2004, now Pat. No. 7,242,101.

(51) Int. Cl.
*H01L 23/48* (2006.01)
*H01L 23/52* (2006.01)
*H01L 29/40* (2006.01)

(52) U.S. Cl. ................... 257/777; 257/724
(58) Field of Classification Search ................. 257/777, 257/686, 723, 724, 778, 784
See application file for complete search history.

(56) References Cited

U.S. PATENT DOCUMENTS

| | | | |
|---|---|---|---|
| 5,618,759 A * | 4/1997 | Boysel | 438/464 |
| 5,963,794 A | 10/1999 | Fogal et al. | |
| 6,175,160 B1 * | 1/2001 | Paniccia et al. | 257/778 |
| 6,215,193 B1 * | 4/2001 | Tao et al. | 257/777 |
| 6,232,667 B1 * | 5/2001 | Hultmark et al. | 257/777 |
| 6,461,897 B2 | 10/2002 | Lin et al. | |
| 6,469,376 B2 * | 10/2002 | Vaiyapuri | 257/686 |
| 6,627,983 B2 * | 9/2003 | Tu et al. | 257/680 |
| 6,730,543 B2 * | 5/2004 | Akram | 438/109 |
| 6,744,141 B2 * | 6/2004 | Kimura | 257/777 |
| 6,777,797 B2 * | 8/2004 | Egawa | 257/686 |
| 6,781,243 B1 * | 8/2004 | Li et al. | 257/777 |
| 6,787,916 B2 * | 9/2004 | Halahan | 257/777 |
| 6,798,055 B2 * | 9/2004 | Vaiyapuri | 257/686 |
| 6,858,938 B2 * | 2/2005 | Michii | 257/777 |
| 7,242,101 B2 * | 7/2007 | Ararao et al. | 257/784 |
| 2003/0148552 A1 | 8/2003 | Halahan | |
| 2003/0162325 A1 | 8/2003 | Tan et al. | |

\* cited by examiner

*Primary Examiner*—S. V Clark
(74) *Attorney, Agent, or Firm*—Mikio Ishimaru

(57) ABSTRACT

An integrated circuit die is provided having a body portion having a singulation side and a pedestal portion extending from the body portion and having a singulation side coplanar with the singulation side of the body portion.

20 Claims, 12 Drawing Sheets

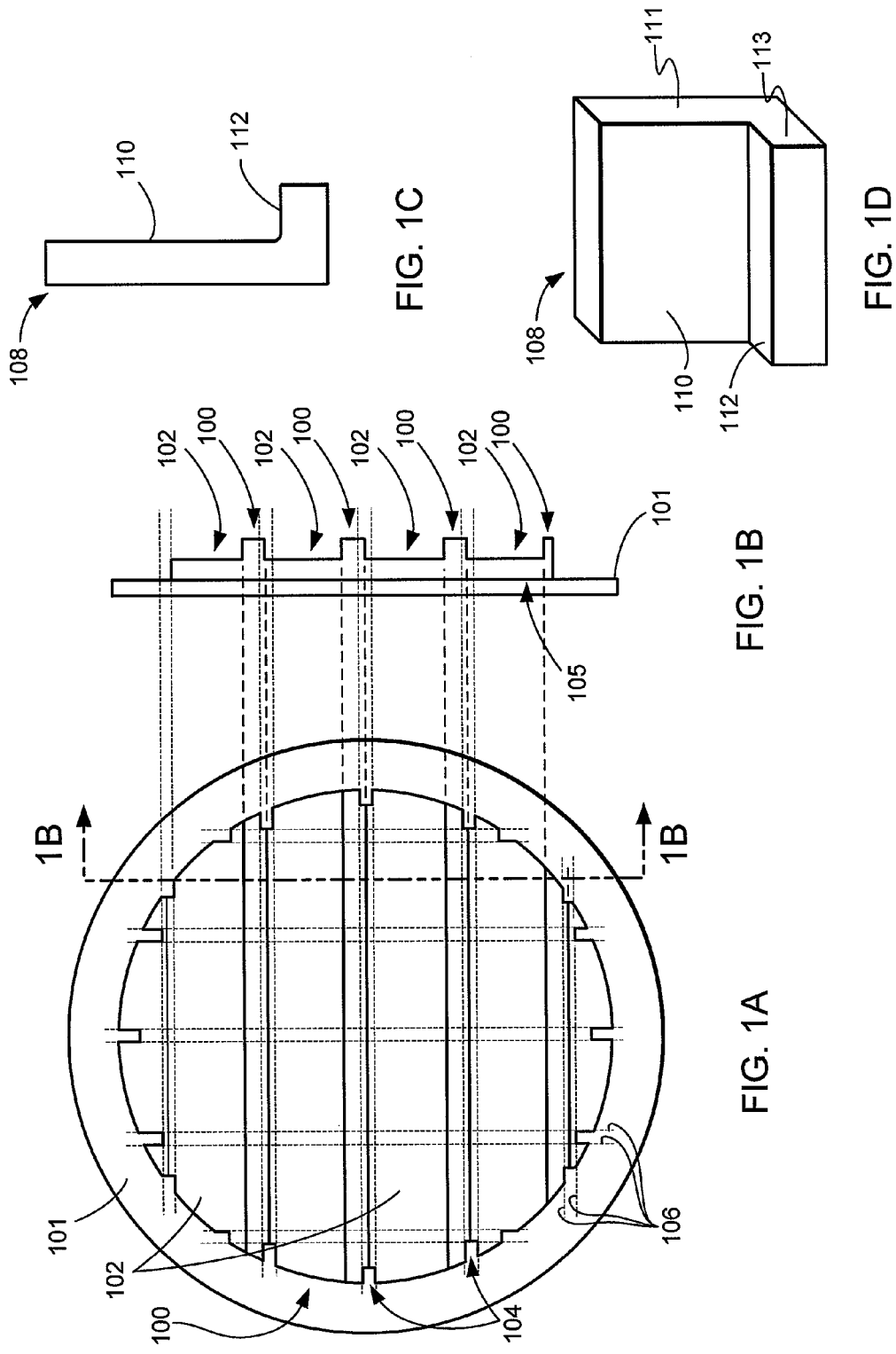

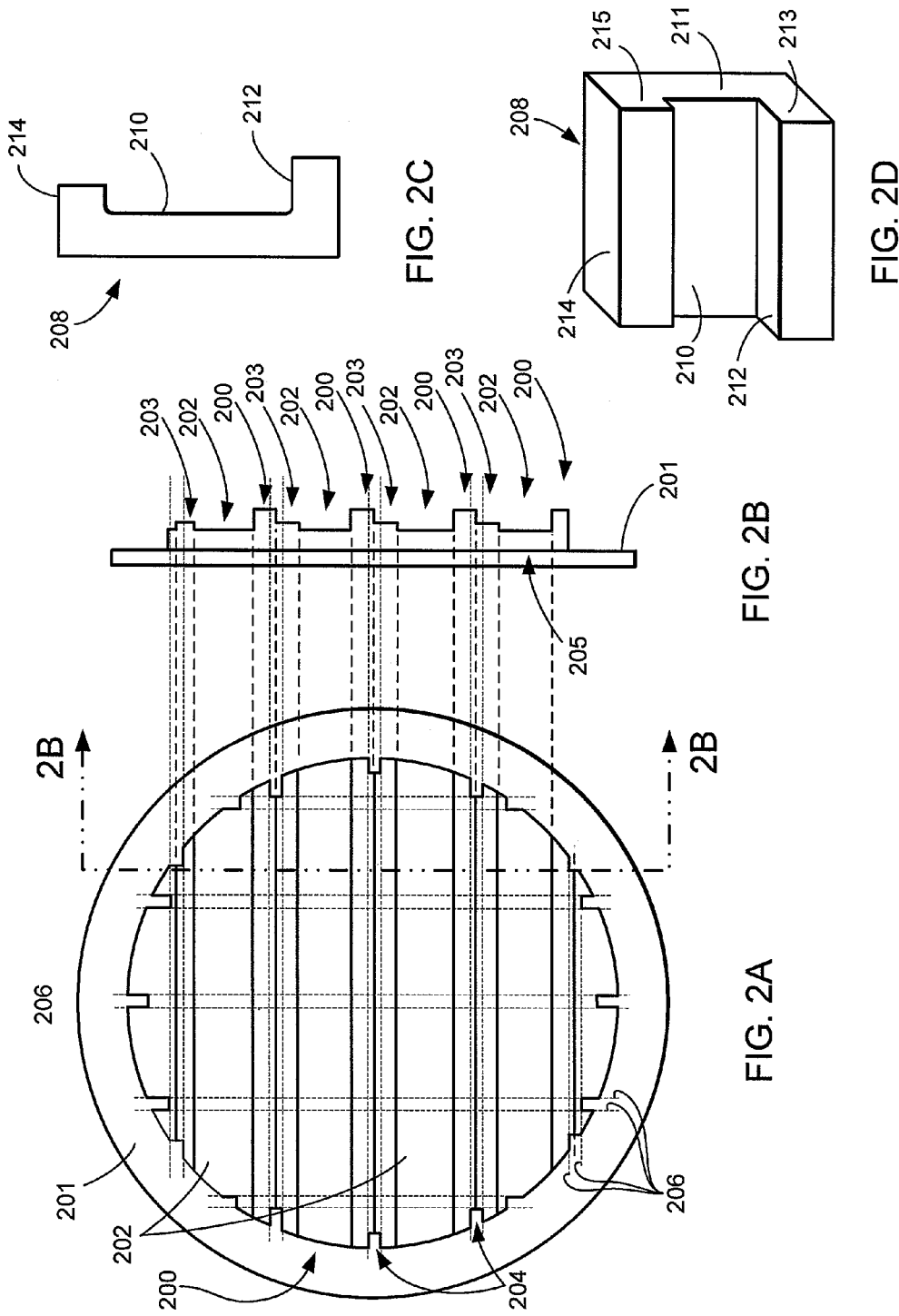

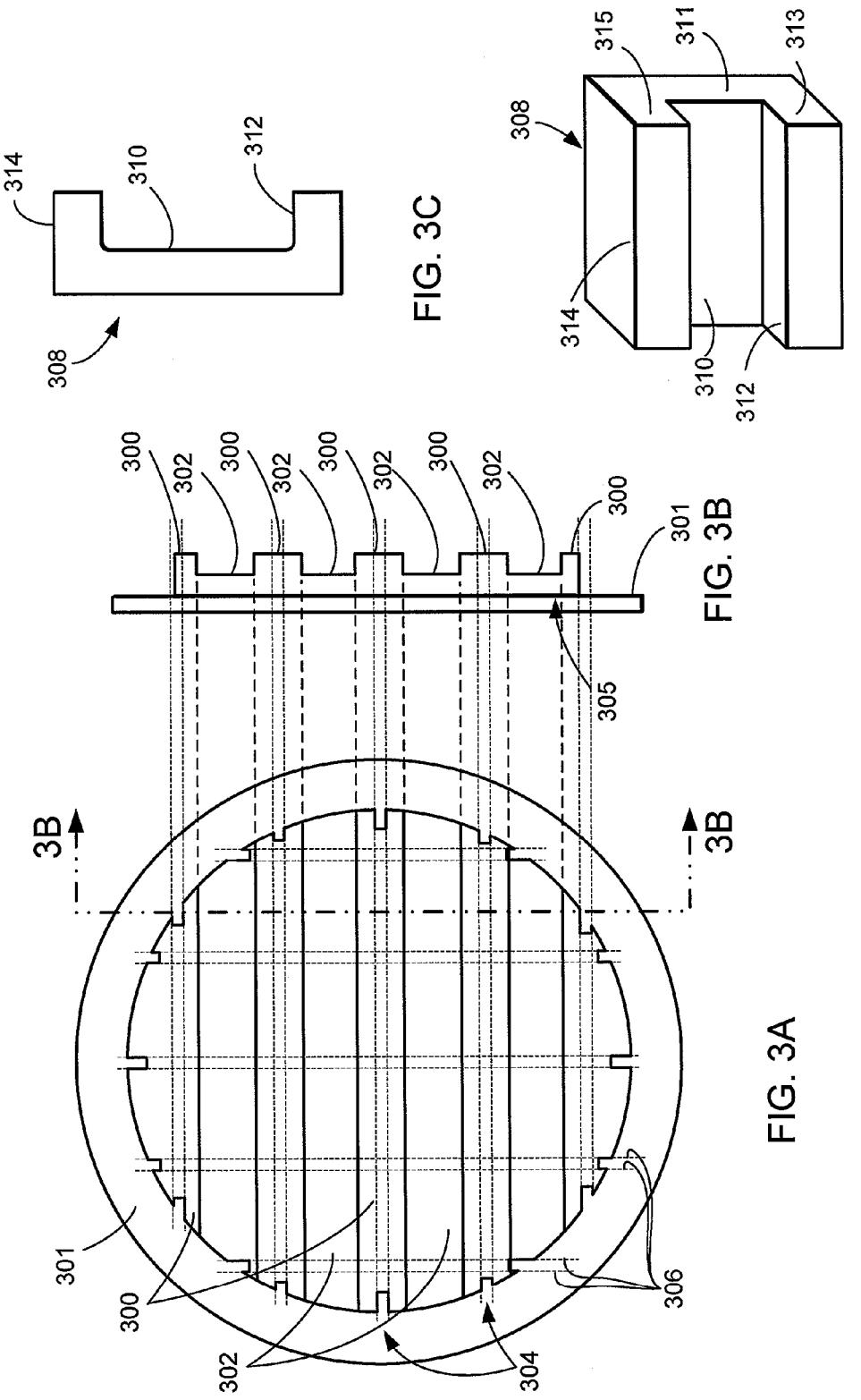

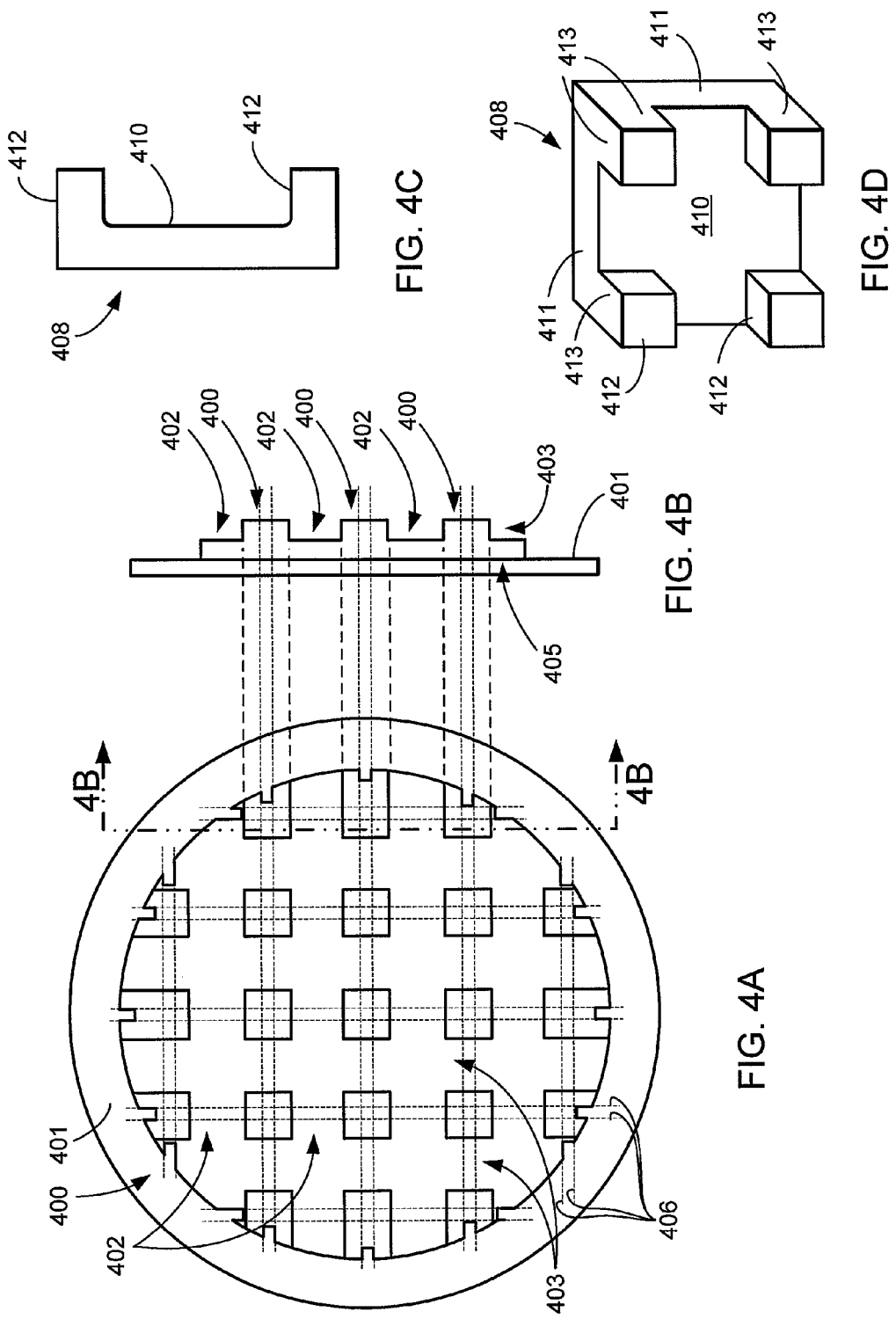

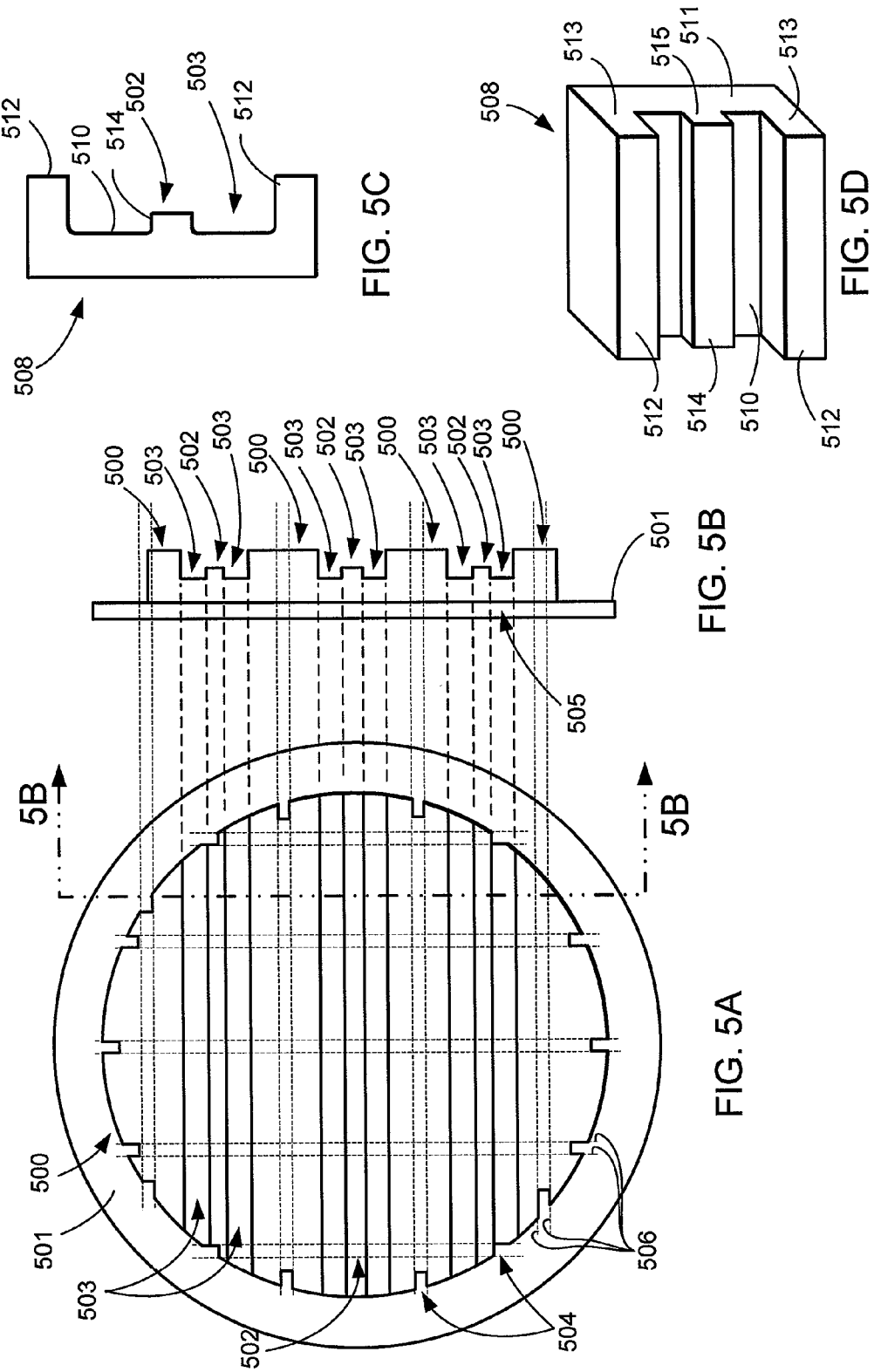

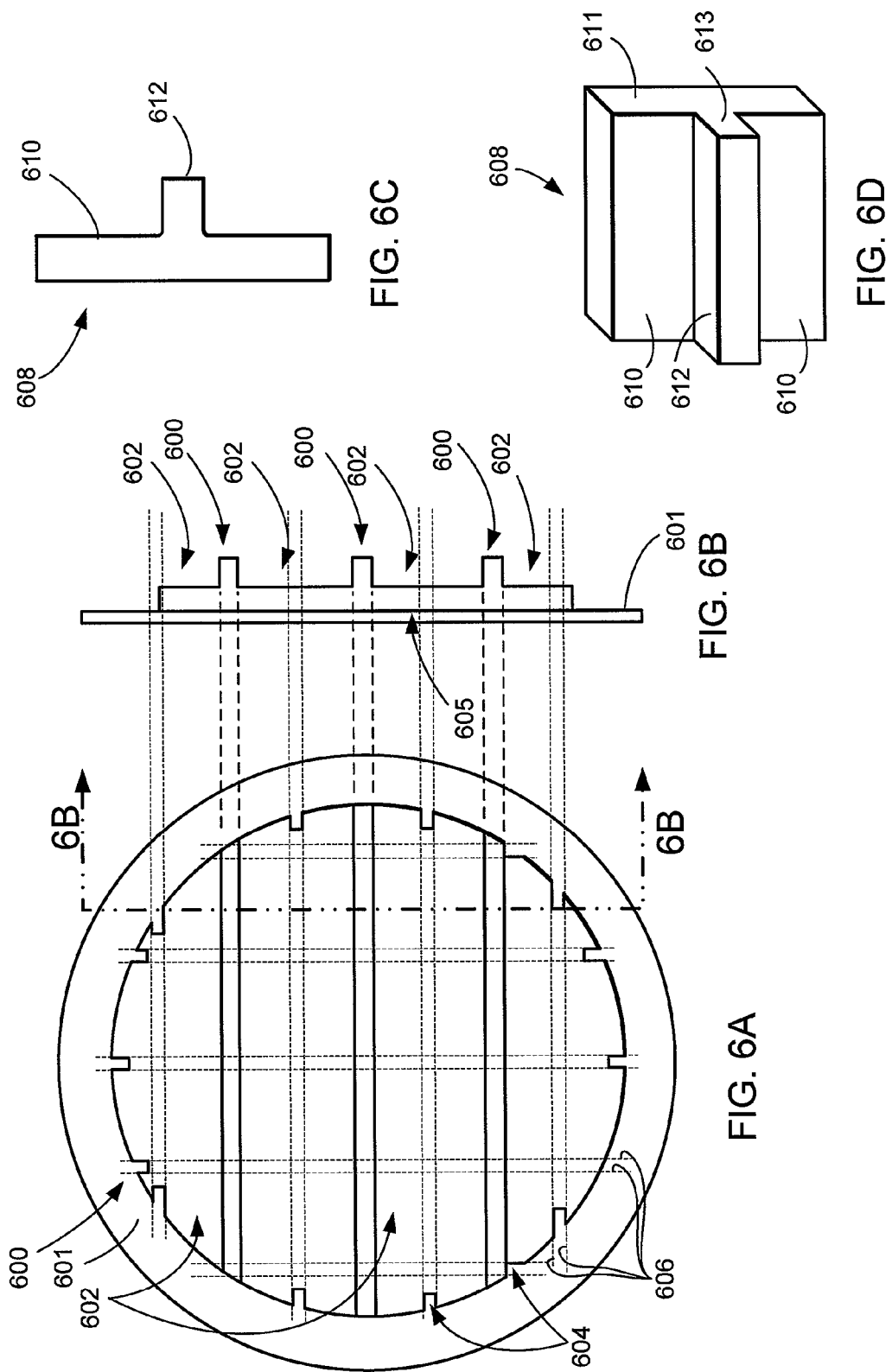

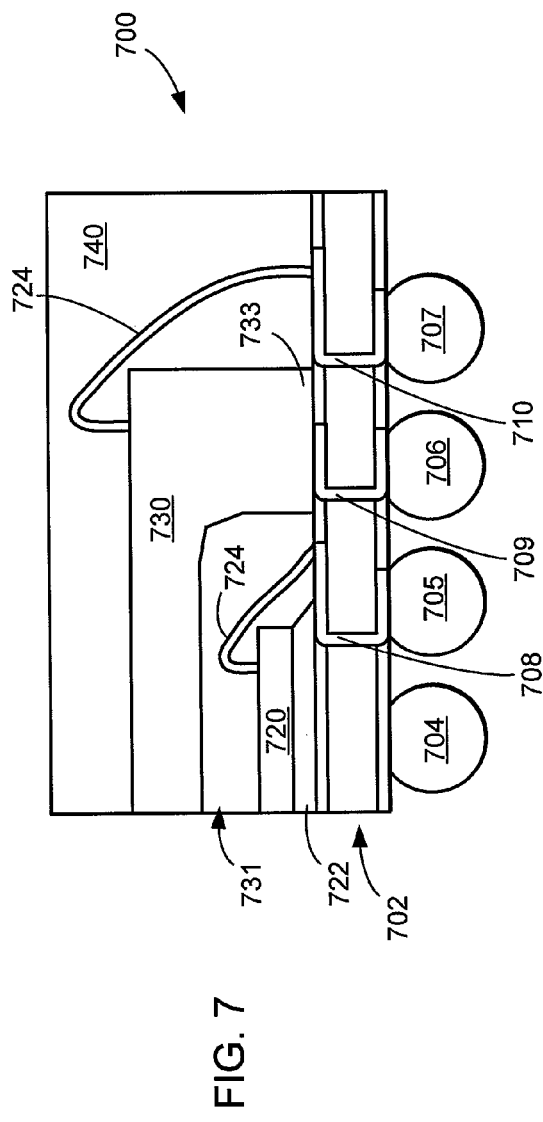
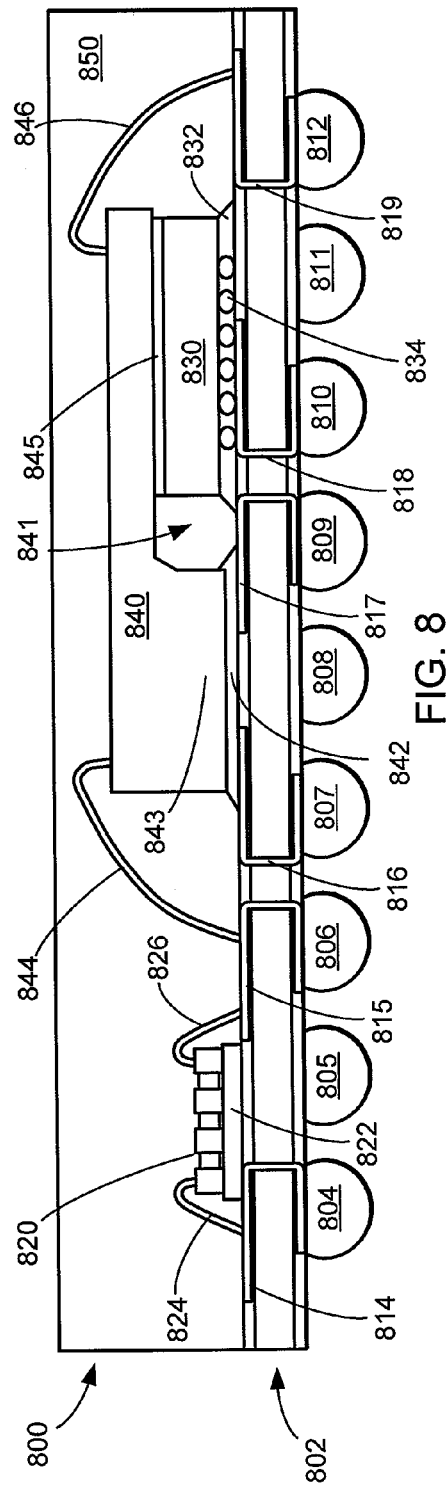

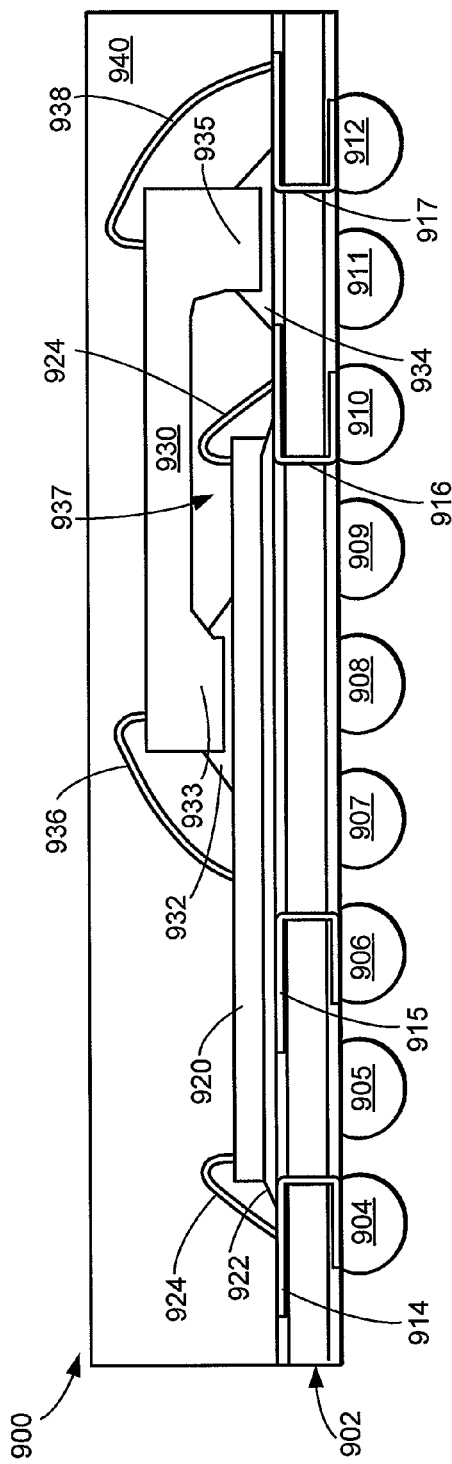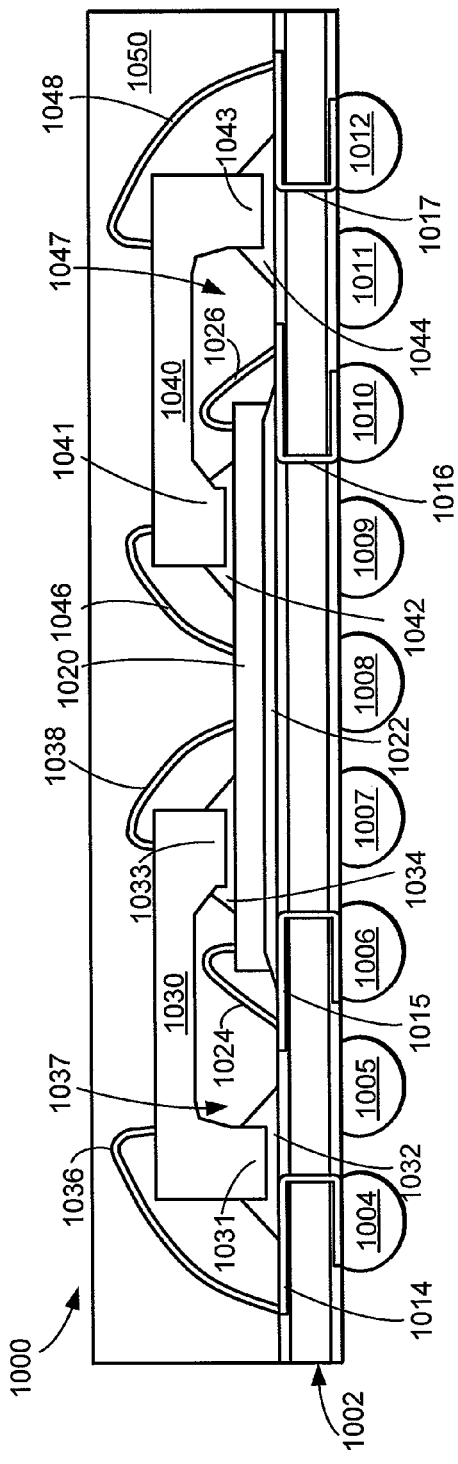

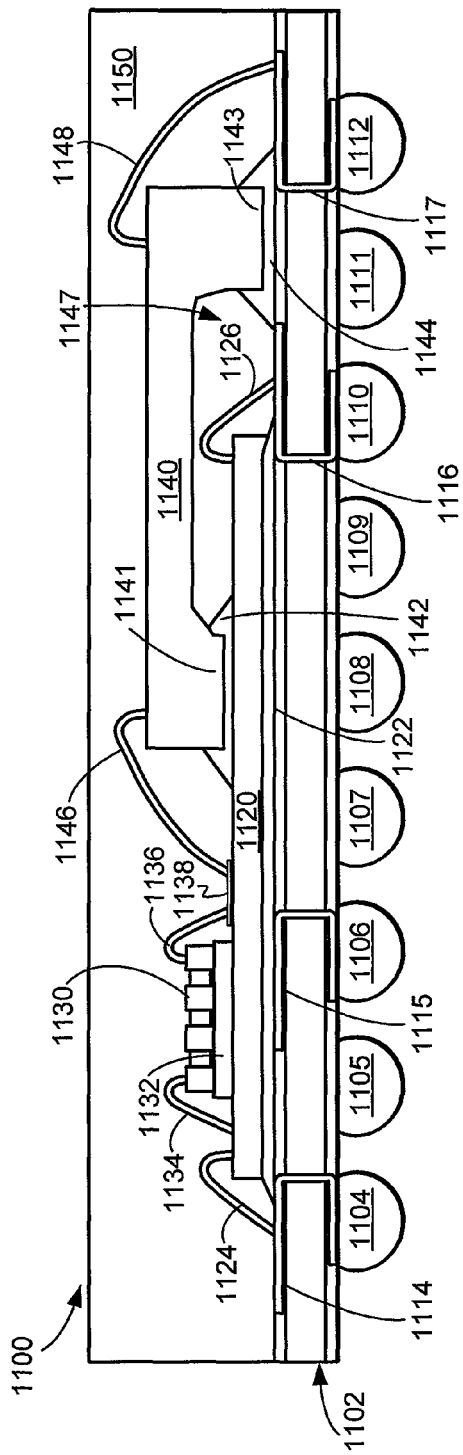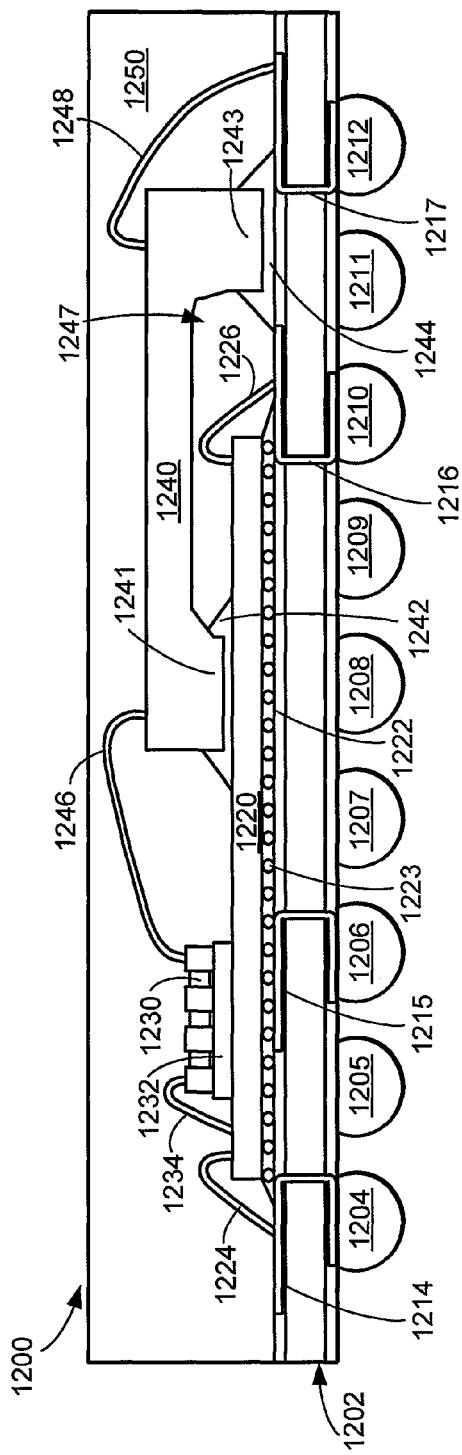

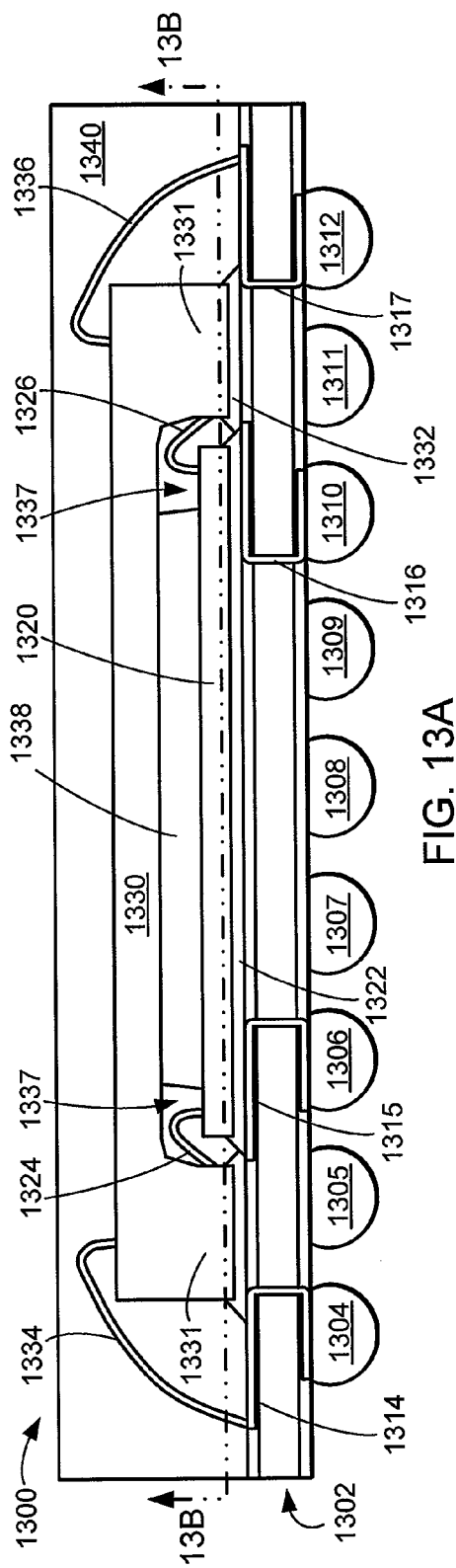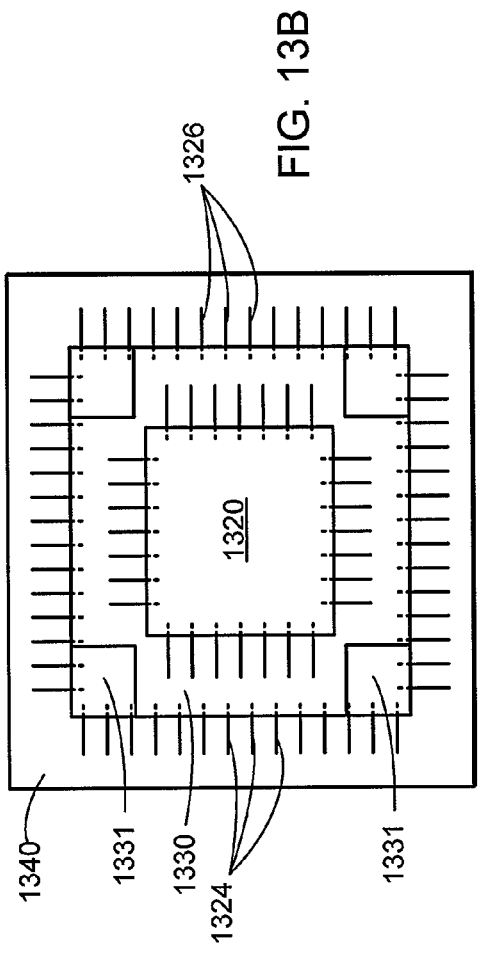

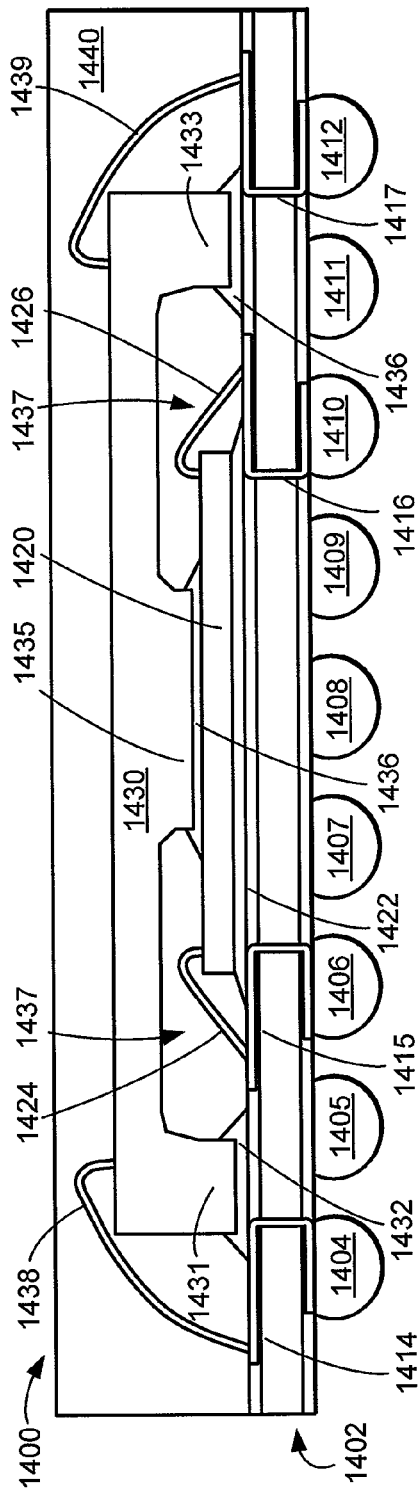
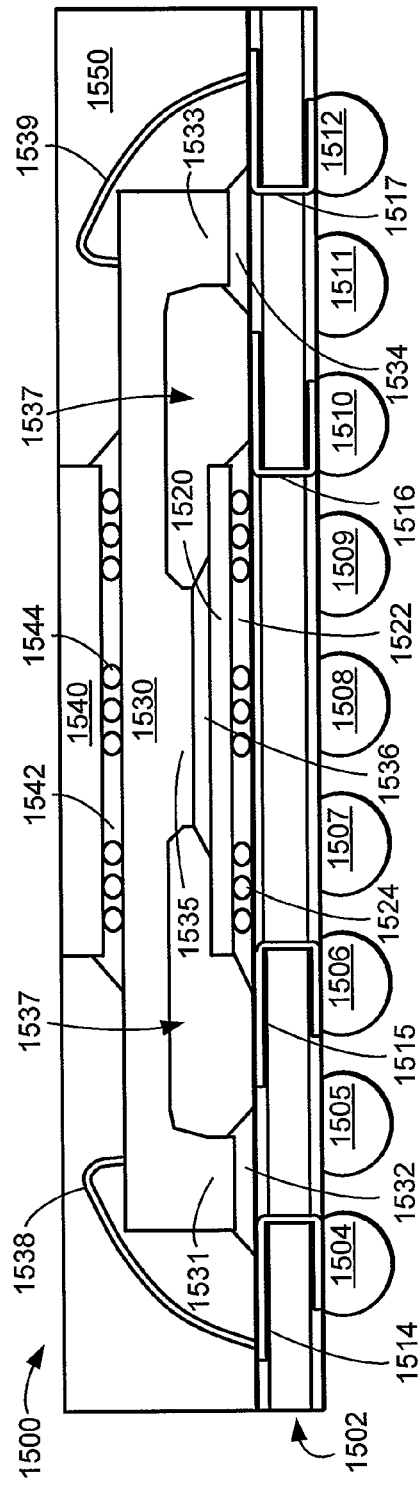
FIG. 14
FIG. 15

US 7,786,593 B2

INTEGRATED CIRCUIT DIE WITH PEDESTAL

CROSS-REFERENCE TO RELATED APPLICATION(S)

This application is a continuation of U.S. Non Provisional patent application Ser. No. 10/894,561 filed Jul. 19, 2004.

TECHNICAL FIELD

The present invention relates generally to semiconductor packages.

BACKGROUND ART

In the electronics industry, as products such as cell phones and camcorders become smaller and smaller, increased miniaturization of integrated circuit (IC) packages has become more and more critical. At the same time, higher performance and lower cost have become essential for new products.

Usually, many individual integrated circuit devices are constructed on the same wafer and groups of integrated circuit devices are separated into individual integrated circuit die.

In order to interface an integrated circuit die with other circuitry, it is common to mount it on a leadframe or on a multi-chip module substrate that is surrounded by a number of lead fingers. Each die has bonding pads that are then individually connected in a wire bonding operation to the lead fingers of the leadframe using extremely fine gold (Au) or aluminum (Al) wires. The assemblies are then packaged by individually encapsulating them in molded plastic, epoxy, or ceramic bodies.

One approach to putting more integrated circuit dies in a single package involves stacking the dies with space between the dies for wire bonding. The space is achieved by means of a thick layer of organic adhesive or in combination with inorganic spacers of material such as silicon (Si), ceramic, or metal. Unfortunately, the stacking adversely affects the performance of the package because of decreased thermal performance due to the inability to remove heat through the organic adhesive and/or inorganic spacers. As the number of dies in the stack increases, thermal resistance increases at a faster rate. Further, such stacked dies have a high manufacturing cost.

Another approach is to put more integrated circuit dies side-by-side in a single package but this results in packages taking up large areas on the printed circuit boards.

Each attempt to reduce the size of the integrated circuit package tends to create additional problems with cost, heat transfer, and electrical performance.

Solutions to these problems have been long sought, but prior developments have not taught or suggested any solutions and, thus, solutions to these problems have long eluded those skilled in the art.

DISCLOSURE OF THE INVENTION

The present invention provides an integrated circuit die having a body portion having a singulation side and a pedestal portion extending from the body portion and having a singulation side coplanar with the singulation side of the body portion. The integrated circuit die may be incorporated in an integrated circuit package that maximizes the input and output through multiple die attachments and allows for integration of passive components in keeping with the increased demand for input and output connections in memory and mixed signal/digital signal processing devices. This reduces the size of the integrated circuit package, and minimizes problems such as high fabrication cost, poor heat transfer, and decreased electrical performance.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 1A is a view of an integrated circuit wafer mounted on mounting tape and formed in accordance with a first embodiment of the present invention;

FIG. 1B is a cross-sectional view of the structure of FIG. 1A taken along line 1B-1B;

FIG. 1C is a cross-sectional view of an L-shape integrated circuit die with body and pedestal portions;

FIG. 1D is an isometric view of the structure of FIG. 1C;

FIG. 2A is a view of an integrated circuit wafer mounted on mounting tape and formed in accordance with a second embodiment of the present invention;

FIG. 2B is a cross-sectional view of the structure of FIG. 2A taken along line 2B-2B;

FIG. 2C is a cross-sectional view of a C-shape integrated circuit die with body and pedestal portions;

FIG. 2D is an isometric view of structure of FIG. 2C;

FIG. 3A is a view of an integrated circuit wafer formed in accordance with a third embodiment of the present invention;

FIG. 3B is a cross-sectional view of the structure of FIG. 3A taken along line 3B-3B;

FIG. 3C is a cross-sectional view of a C-shape integrated circuit die with body and pedestal portions;

FIG. 3D is an isometric view of the structure of FIG. 3C;

FIG. 4A is a view of an integrated circuit wafer formed in accordance with a fourth embodiment of the present invention;

FIG. 4B is a cross-sectional view of the structure of FIG. 4A taken along line 4B-4B;

FIG. 4C is a cross-sectional view of a four-pedestal-shape integrated circuit die with body and pedestal portions;

FIG. 4D is an isometric view of the structure of FIG. 4C;

FIG. 5A is a view of an integrated circuit wafer formed in accordance with a fifth embodiment of the present invention;

FIG. 5B is a cross-sectional view of the structure of FIG. 5A taken along line 5B-5B;

FIG. 5C is a cross-sectional view of an E-shape integrated circuit die with body and pedestal portions;

FIG. 5D is an isometric view of the structure of FIG. 5C;

FIG. 6A is a view of an integrated circuit wafer formed in accordance with a sixth embodiment of the present invention;

FIG. 6B is a cross-sectional view of the structure of FIG. 6A taken along line 6B-6B;

FIG. 6C is a cross-sectional view of a T-shape integrated circuit die with body and pedestal portions;

FIG. 6D is an isometric view of the structure of FIG. 6C;

FIG. 7 is a cross-sectional view of an L-shape integrated circuit die package;

FIG. 8 is a cross-sectional view of a stacked L-shape integrated circuit die package with passive and active components;

FIG. 9 is a cross-sectional view of a stacked semi-C-shape integrated circuit die package;

FIG. 10 is a cross-sectional view of a stacked double semi-C-shape integrated circuit die package;

FIG. 11 is a cross-sectional view of a stacked semi-C-shape integrated circuit die package with passive and active components using wire bonds;

FIG. 12 is a cross-sectional view of a semi-C-shape integrated circuit die package with passive and active components using wire and solder bonds;

FIG. 13A is a cross-sectional view of a four-pedestal-shape integrated circuit die package with an active component;

FIG. 13B is a horizontal cross-sectional view of the structure of FIG. 13A taken along line 13B-13B;

FIG. 14 is a cross-sectional view of a stacked semi-C-shape integrated circuit die package with an active component using wire bonding;

FIG. 15 is a cross-sectional view of a multiple stacked semi-C-shape integrated circuit die package with active components using solder bonding;

BEST MODE FOR CARRYING OUT THE INVENTION

Figure 16:
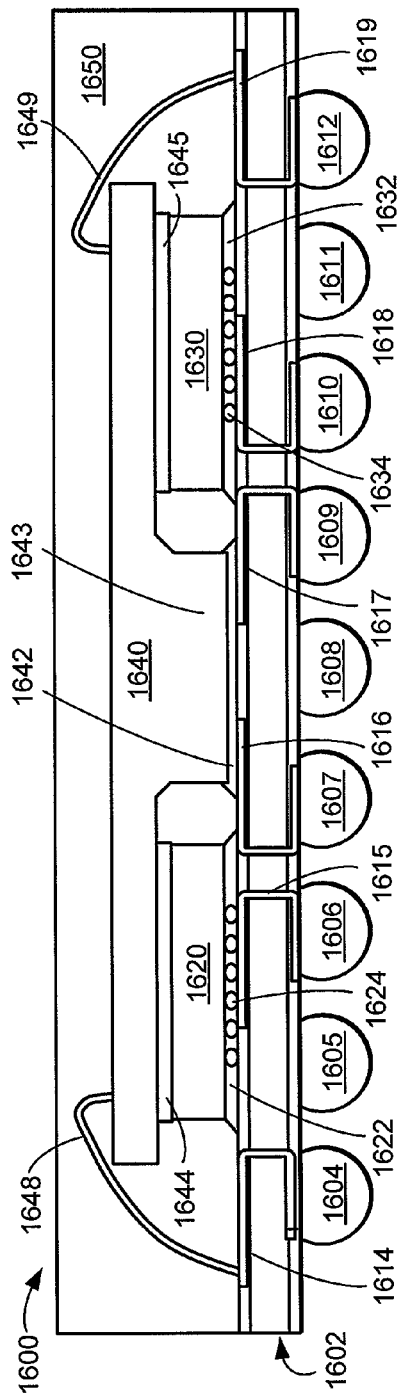
FIG. 16 is a cross-sectional view of a stacked T-shape integrated circuit die package with active components using solder bonding.

In the present invention, semiconductor wafers are processed to form an integrated circuit wafer carrying a large number of integrated circuits in and on the top. The bottom of the integrated circuit wafer is then processed by mechanical or chemical means to form integrated circuit die comprised of a body portion having a singulation side and a pedestal portion extending from the body portion and having a singulation side coplanar with the singulation side of the body portion. Singulation is the process by which the integrated circuit wafer is divided into individual integrated circuit dies.

A plane coplanar with the integrated circuit wafer defines a horizontal plane with the top of the wafer carrying the integrated circuits and the bottom of the wafer being processed to form the pedestal portions of the integrated circuit die. Solder spheres below an integrated circuit die are referred to as solder bumps and below a package substrate are referred to as solder balls.

Referring now to FIG. 1A, therein is shown an integrated circuit wafer 100 mounted on mounting tape 101 and formed in accordance with a first embodiment of the present invention. The wafer 100 with predefined saw guides 104 is mounted with integrated circuits 105 face down on the mounting tape 101. The bottom of the wafer 100 is then processed by mechanical or chemical means, such as sawing or etching, to form spaced-apart, parallel, recessed areas 102.

It should be noted that the saw guides 104 are preformed around the peripheral of the wafer 100 by mounting the wafer 100 with its bottom side down on a mounting tape (not shown). A process, such as sawing, forms the saw guides 104 aligned with saw streets (not shown) defined by integrated circuits 105 on top of the wafer 100. After the saw guides 104 are formed, the wafer 100 is removed from the initial mounting tape and mounted on the mounting tape 101. These saw guides 104 are not only to serve as reference locations for forming the recessed areas 102, but also to allow accurate singulation of the wafer 100 by a process, such as sawing, along lines 106 parallel to and perpendicular to the recessed areas 102.

Referring now to FIG. 1B, therein is shown a cross-sectional view of the structure of FIG. 1A taken along line 1B-1B. The wafer 100 is shown processed with the recessed areas 102 separated by unprocessed thicknesses of the wafer 100. During the singulation process, the wafer 100 will be mechanically separated by a process, such as sawing, along lines 106 which will cut both portions of the full thickness of the wafer 100 as well as portions through the recessed areas 102.

Referring now to FIG. 1C, therein is shown a cross-sectional view of an L-shape integrated circuit die 108 with a body portion 110 and a pedestal portion 112. The L-shape integrated circuit die 108 has a L-shape cross-section parallel to one of the lines 106 defining at least one singulation side and has a rectangular cross-section perpendicular to the defined singulation side.

Referring now to FIG. 1D, therein is shown an isometric view of the structure of FIG. 1C. The L-shape integrated circuit die 108 is comprised of the body portion 110 having a singulation side 111 and the pedestal portion 112 having a singulation side 113 coplanar with the singulation side 111. The sides on the other side of the L-shape integrated circuit die 108 from the singulation sides 111 and 113 may also be singulation sides that are coplanar.

Referring now to FIG. 2A, therein is shown an integrated circuit wafer 200 mounted on mounting tape 201 and formed in accordance with a second embodiment of the present invention. The wafer 200 with predefined saw guides 204 is mounted with integrated circuits 205 facing down on the mounting tape 201. The bottom of the wafer 200 is then processed by a mechanical or chemical means, such as sawing or etching, to form first spaced-apart, parallel, recessed areas 202. The bottom of the wafer 200 is also processed by a mechanical means, such as sawing or etching, to form second spaced-apart, parallel, recessed areas 203 that are adjacent to and parallel to the recessed areas 202. The recessed areas 202 and 203 are of a different depth and different widths from each other with the embodiment shown having deeper recessed areas 202.

It should be noted that the saw guides 204 are preformed around the peripheral of the wafer 200 by mounting the wafer 200 with its bottom side down on a mounting tape (not shown). A process, such as sawing, forms the saw guides 204 aligned with saw streets (not shown) defined by integrated circuits 205 on top of the wafer 200. After the saw guides 204 are formed, the wafer 200 is removed from the initial mounting tape and mounted on the mounting tape 201. These saw guides 204 are not only to serve as reference locations for forming the recessed areas 202 and 203, but also to allow accurate singulation of the wafer 200 by sawing along lines 206 parallel to and perpendicular to the recessed areas 202 and 203. Where the recessed areas 202 are deeper than the recessed areas 203, the singulation is through the recessed areas 203 to form dies having semi-C-shape cross-sections in one direction and rectangular-shape cross-sections in the perpendicular direction.

Referring now to FIG. 2B, therein is shown a cross-sectional view of the structure of FIG. 2A taken along line 2B-2B. The wafer 200 is shown processed with the recessed areas 202 separated by unprocessed thicknesses of the wafer 200. During the singulation process, the wafer 200 will be mechanically separated by a process, such as sawing, along the lines 206 which will cut both a portion of the full thickness of the wafer 200 as well as a portion through the recessed areas 203.

Referring now to FIG. 2C, therein is shown a cross-sectional view of a semi-C-shape integrated circuit die 208 with a body portion 210 and pedestal portions 212 and 214. In the configuration shown, the pedestal portion 212 is thicker than the pedestal portion 214. The semi-C-shape integrated circuit die 208 has a semi-C-shape cross-section parallel to one of the lines 206 defining at least one singulation side and has a rectangular cross-section perpendicular to the defined singulation side.

Referring now to FIG. 2D, therein is shown an isometric view of the structure of FIG. 2C. The semi-C-shape integrated circuit die 208 is comprised of the body portion 210 having a singulation side 211 and the pedestal portion 212 having a singulation side 213 coplanar with the singulation side 211. The pedestal portion 214 has a singulation side 215 also coplanar with the singulation side 211. The sides on the other side of the semi-C-shape integrated circuit die 208 from the singulation sides 211, 213, and 215 may also be singulation sides that are coplanar.

Referring now to FIG. 3A, therein is shown an integrated circuit wafer 300 formed in accordance with a third embodiment of the present invention. Integrated circuits 305 are on the top of the wafer 300 with predefined saw guides 304 and the bottom is processed by mechanical or chemical means, such as sawing or etching, to form spaced-apart, parallel, recessed areas 302.

It should be noted that the saw guides 304 are preformed around the peripheral of the wafer 300 by mounting the wafer 300 with its bottom side down on a mounting tape (not shown). A process, such as sawing, forms the saw guides 304 aligned with saw streets (not shown) defined by integrated circuits 305 on top of the wafer 300. After the saw guides 304 are formed, the wafer 300 is removed from the initial mounting tape and mounted on the mounting tape 301. These saw guides 304 are not only to serve as reference locations for forming the recessed areas 302, but also to allow accurate singulation of the wafer 300 by sawing along lines 306 parallel to and perpendicular to the recessed areas 302.

Referring now to FIG. 3B, therein is shown a cross-sectional view of the structure of FIG. 3A taken along line 3B-3B. The wafer 300 is shown processed with the recessed areas 302 separated by unprocessed thicknesses of the wafer 300. During the singulation process, the wafer 300 will be mechanically separated by a process, such as sawing, along lines 306 which will cut portions of the full thickness of the wafer 300.

Referring now to FIG. 3C, therein is shown a cross-sectional view of a C-shape integrated circuit die 308 having a body portion 310, and first and second pedestal portions 312 and 314. The recessed area 302 defines the first and second pedestal portions 312 and 314. The C-shape integrated circuit die 308 has a C-shape cross-section parallel to one of the lines 306 defining at least one singulation side and has a rectangular cross-section perpendicular to the defined singulation surface.

Referring now to FIG. 3D, therein is shown an isometric view of the structure of FIG. 3C. The C-shape integrated circuit die 308 is comprised of the body portion 310 having a singulation side 311 and the first pedestal portion 312 having a singulation side 313 coplanar with the singulation side 313. The second pedestal portion 314 has a singulation side 315 also coplanar with the singulation side 311. The sides on the other side of the C-shape integrated circuit die 308 from the singulation sides 311, 313, and 315 may also be singulation sides that are coplanar.

Referring now to FIG. 4A, therein is shown an integrated circuit wafer 400 formed in accordance with a fourth embodiment of the present invention. Integrated circuits 405 are on the top of the wafer 400 with predefined saw guides 404 and the bottom is processed by mechanical or chemical means, such as sawing or etching, to form spaced-apart, parallel, first recessed areas 402 and spaced-apart, parallel, second recessed areas 403. The first and second recessed areas 402 and 403 are of the same depth, but are perpendicular to each other.

It should be noted that the saw guides 404 are preformed around the peripheral of the wafer 400 by mounting the wafer 400 with its bottom side down on a mounting tape (not shown). A process, such as sawing, forms the saw guides 404 aligned with saw streets (not shown) defined by integrated circuits 405 on top of the wafer 400. After the saw guides 404 are formed, the wafer 400 is removed from the initial mounting tape and mounted on the mounting tape 401. These saw guides 404 are not only to serve as reference locations for forming the recessed areas 402 and 403, but also to allow accurate singulation of the wafer 400 by a process, such as sawing, along lines 406 parallel to and perpendicular to the recessed areas 402 and 403. This forms dies having four pedestals.

Referring now to FIG. 4B, therein is shown a cross-sectional view of the structure of FIG. 4A taken along line 4B-4B. The wafer 400 is shown processed with the first and second recessed areas 402 and 403 separated by unprocessed thicknesses of the wafer 400. During the singulation process, the wafer 400 will be mechanically separated by a process, such as sawing, along lines 406 which will cut both a portion of the full thickness of the wafer 400 as well as portions through the first and second recessed areas 402 and 403 to form a die having four pedestals.

Referring now to FIG. 4C, therein is shown a cross-sectional view of a four-pedestal-shape integrated circuit die 408 with a body portion 410 and two pedestal portions 412 shown. Four pedestal portions 412 are defined by the intersection of the first and second recessed areas 402 and 403 of FIG. 4A. The cross-sectional view is parallel to one of the lines 406. The four-pedestal-shape integrated circuit die 408 has a C-shape cross-section parallel to one of the lines 406 defining at least one singulation side and has a C-shape cross-section perpendicular to the defined singulation surface in one region and a rectangular cross-section in another region.

Referring now to FIG. 4D, therein is shown an isometric view of the structure of FIG. 4C. The four-pedestal-shape integrated circuit die 408 is comprised of the body portion 410 having singulation sides 411 and four pedestal portions 412 extending from the corners of the body portion 410 and having singulation sides 413 coplanar with the singulation sides 411. The singulation sides 411 are coplanar with the singulation sides 413 that are immediately below; i.e., all four sides have coplanar singulation sides.

Referring now to FIG. 5A, therein is shown an integrated circuit wafer 500 formed in accordance with a fifth embodiment of the present invention. Integrated circuits 505 are on the top of the wafer 500 with predefined saw guides 504 and the bottom is processed by mechanical or chemical means, such as sawing or etching, to form spaced-apart, parallel, first recessed areas 502. The bottom of the wafer 500 is further processed by mechanical or chemical means, such as sawing or etching, to form spaced-apart, parallel, second recessed areas 503. The first and second recessed areas 502 and 503 are parallel and of different depths, with the second recessed areas 503 deeper into the wafer 500 than the first recessed areas 502. The first recessed areas 502 also separate the second recessed areas 503.

It should be noted that the saw guides 504 are preformed around the peripheral of the wafer 500 by mounting the wafer 500 with its bottom side down on a mounting tape (not shown). A process, such as sawing, forms the saw guides 504 aligned with saw streets (not shown) defined by integrated circuits 505 on top of the wafer 500. After the saw guides 504 are formed, the wafer 500 is removed from the initial mounting tape and mounted on the mounting tape 501. These saw guides 504 are not only to serve as reference locations for forming the recessed areas 502 and 503, but also to allow accurate singulation of the wafer 500 by a process, such as sawing, along lines 506 parallel to and perpendicular to the recessed areas 502 and 503.

Referring now to FIG. 5B, therein is shown a cross-sectional view of the structure of FIG. 5A taken along line 5B-5B. The wafer 500 is shown processed with the second recessed areas 503 separated by unprocessed thicknesses of the wafer 500 and by the first recessed areas 502. During the singulation process, the wafer 500 will be mechanically separated by a process, such as sawing, along lines 506, which cut portions of the full thickness of the wafer 500.

Referring now to FIG. 5C, therein is shown a cross-sectional view of an E-shape integrated circuit die 508 with a body portion 510, two first pedestal portions 512, and a second pedestal portion 514 that is shorter than the two first pedestal portions 512. The first recessed areas 502 define the two first pedestal portions 512 and the second pedestal portion 514 is defined by depth of the second recessed area 503. The E-shape integrated circuit die 508 has an E-shape cross-section parallel to one of the lines 506 defining at least one singulation side and has a rectangular cross-section perpendicular to the defined singulation surface.

Referring now to FIG. 5D, therein is shown an isometric view of the structure of FIG. 5C. The E-shape integrated circuit die 508 is comprised of the body portion 510 having a singulation side 511 and the first and second pedestal portions 512 having singulation sides 513 coplanar with the singulation side 511. A third pedestal portion 514 has a singulation side 515 coplanar with the singulation side 511. The sides on the other side of the E-shape integrated circuit die 508 from the singulation sides 511, 513, and 515 may also be singulation sides that are coplanar.

Referring now to FIG. 6A, therein is shown an integrated circuit wafer 600 formed in accordance with a sixth embodiment of the present invention. Integrated circuits 605 are on the top of the wafer 600 with predefined saw guides 604 and the bottom is processed by mechanical or chemical means, such as sawing or etching, to form spaced-apart, parallel, recessed areas 602.

It should be noted that the saw guides 604 are preformed around the peripheral of the wafer 600 by mounting the wafer 600 with its bottom side down on a mounting tape (not shown). A process, such as sawing, forms the saw guides 604 aligned with saw streets (not shown) defined by integrated circuits 605 on top of the wafer 600. After the saw guides 604 are formed, the wafer 600 is removed from the initial mounting tape and mounted on the mounting tape 601. These saw guides 604 are not only to serve as reference locations for forming the recessed areas 602, but also to allow accurate singulation of the wafer 600 by a process, such as sawing, along lines 606 parallel to and perpendicular to the recessed areas 602.

Referring now to FIG. 6B, therein is shown a cross-sectional view of the structure of FIG. 6A taken along line 6B-6B. The wafer 600 is shown processed with the recessed areas 602 separated by unprocessed thicknesses of the wafer 600. During the singulation process, the wafer 600 will be mechanically separated by a process, such as sawing, along lines 606 which will cut through the center of the recessed areas 602.

Referring now to FIG. 6C, therein is shown a cross-sectional view of a T-shape integrated circuit die 608 with a body portion 610 and a pedestal portion 612. The T-shape integrated circuit die 608 has a T-shape cross-section parallel to one of the lines 606 defining at least one singulation side and has rectangular cross-sections perpendicular to the defined singulation surface.

Referring now to FIG. 6D, therein is shown an isometric view of the structure of FIG. 6C. The T-shape integrated circuit die 608 is comprised of the body portion 610 having a singulation side 611 and the pedestal portion 612 having a singulation side 613 coplanar with the singulation side 611. The sides on the other side of the T-shape integrated circuit die 608 from the singulation sides 611 and 613 may also be singulation sides that are coplanar.

Referring now to FIG. 7, therein is shown a cross-sectional view of an L-shape integrated circuit die package 700. The L-shape integrated circuit die package 700 includes a package substrate 702 with ball grid array (BGA) solder balls 704 through 707 connected to various through conductors. The solder balls 705 through 707 are respectively connected to through conductors 708 through 710.

It will be understood that each solder ball or bond wire shown in the FIGs. represent a number of solder balls, through conductors, or bond wires on a package substrate extending in arrays or linearly perpendicular to the cross-sectional view shown. The solder balls, the bond wires, and bond balls are generically referred to as bond connections. Further, the BGA package is representative of different types of package electrical conductors that can form various types of integrated circuit packages including leaded and leadless packages.

A die 720 is bonded to the package substrate 702 by an adhesive 722. The die 720 may be an integrated circuit die or a dummy die so it is generically referred to as a die. Bond wires 724 connect the die 720 to the through conductors 708.

An L-shape integrated circuit die 730 is the same as the L-shaped integrated circuit die 108 of FIG. 1D but is positioned with its recessed area 731 over the die 720. The recessed area 731 may have square corners or angled corners as shown in FIG. 7, which increase pedestal stability. The L-shape integrated circuit die 730 bonded to the through conductors 709 at its pedestal portion 733. Bond wires 724 connect he L-shape integrated circuit die 730 to the through conductors 710.

A mold compound 740 is then formed around the various components to encapsulate the various components on the package substrate 702.

Referring now to FIG. 8, therein is shown a cross-sectional view of a stacked L-shape integrated circuit die package 800 with passive and active components. The L-shape integrated circuit die application package 800 has a package substrate 802 that includes solder balls 804 through 812 connected to various through conductors. The solder balls 804, 806, 807, 809, 810, and 812 are respectively connected to through conductors 814, 815, 816, 817, 818, and 819.

A passive component 820 is bonded by adhesive 822 to the package substrate 802 and can be optionally connected to the through conductors 814 and 815 by bond wires 824 and 826, respectively.

A die 830, an active component, is connected by an adhesive 832 to the package substrate 802. The adhesive 832 also contains solder bumps 834 for connecting the die 830 to various through conductors, such as the through conductors 818.

An L-shape integrated circuit die 840 is the same as the L-shaped integrated circuit die 108 of FIG. 1D but is positioned with its recessed area 841 over the die 830. The recessed area 841 may have a square or angled corner as shown in FIG. 8.

The L-shape integrated circuit die 840 is bonded to the package substrate 802 by an adhesive 842 at its pedestal portion 843 and to the top of the die 830 by an adhesive 845. The adhesives 842 and 845 may be adhesive or thermal interface materials. Bond wires 844 and 846 connect the L-shape integrated circuit die 840 respectively to the through conductors 815 and 819. The bond wires 826, the through conductors 815, and the bond wires 844 may also interconnect the passive component 820 and the L-shape integrated circuit die 840.

A mold compound 850 is then formed around the various components to encapsulate the various components on the package substrate 802.

Referring now to FIG. 9, therein is shown a cross-sectional view of a stacked semi-C-shape integrated circuit die package 900. The semi-C-shape integrated circuit die package 900 includes a package substrate 902 having solder balls 904 through 912 connected to various through conductors. The solder balls 904, 906, 910, and 912 are respectively connected to through conductors 914, 915, 916, and 917.

A die 920, an active component, is bonded to the package substrate 902 by an adhesive 922. The die 920 is connected by bond wires 924 to the through conductors 914 and by bond wires 924 to the through conductors 916.

A semi-C-shape integrated circuit die 930 is the same as the semi-C-shape integrated circuit die 208 of FIG. 2D but is bonded to the die 920 by an adhesive 932 at a short pedestal portion 933 and to the package substrate 902 by an adhesive 934 at a long pedestal portion 935. The semi-C-shape integrated circuit die 930 is connected by bond wires 936 to die 920 and by bond wires 938 to the through conductors 917. The recessed area 937 of the semi-C-shape integrated circuit die 930 is sufficiently deep to clear the bond wires 924 of the die 920.

A mold compound 940 is then formed around the various components to encapsulate the various components on the package substrate 902.

Referring now to FIG. 10, therein is shown a stacked double semi-C-shape integrated circuit die package 1000. The double semi-C-shape integrated circuit die package 1000 includes a package substrate 1002 having solder balls 1004 through 1012 connected to various through conductors. The solder balls 1004, 1006, 1010, and 1012 are respectively connected to through conductors 1014, 1015, 1016, and 1017.

A die 1020 is bonded to the package substrate 1002 by an adhesive 1022. Bond wires 1024 connect the die 1020 to the through conductors 1015 and by bond wires 1026 to the through conductors 1016.

A first semi-C-shape integrated circuit die 1030 is the same as the semi-C-shape integrated circuit die 208 of FIG. 2D but is bonded to the package substrate 1002 at a first pedestal portion 1031 by an adhesive 1032 and to the die 1020 at a shorter second pedestal portion 1033 by an adhesive 1034. The first semi-C-shape integrated circuit die 1030 is connected by bond wires 1036 to the conductors 1014 and by bond wires 1038 to the die 1020. The recess 1037 of the first semi-C-shape integrated circuit die 1030 is sufficiently deep to clear the bond wires 1024 of the die 1020. The recess 1037 is beveled at both inside ends.

A second semi-C-shape integrated circuit die 1040 is the same as the semi-C-shape integrated circuit die 208 of FIG. 2D but is bonded to the die 1020 at a first pedestal portion 1041 by an adhesive 1042 and to the package substrate 1002 at a second longer pedestal portion 1043 by an adhesive 1044. The second semi-C-shape integrated circuit die 1040 is connected to the die 1020 by bond wires 1046 and by bond wires 1048 to the through conductors 1017. The recess 1047 of the second semi-C-shape integrated circuit die 1040 is sufficiently deep to clear the bond wires 1026 of the die 1020. The recess 1047 is beveled at both inside ends.

A mold compound 1050 is then formed around the various components to encapsulate the various components on the package substrate 1002.

Referring now to FIG. 11, therein is shown a cross-sectional view of a stacked semi-C-shape integrated circuit die package 1100 with passive and active components using wire bonds. The semi-C-shape integrated circuit die application package 1100 includes a package substrate 1102 having solder balls 1104 through 1112. The solder balls 1104, 1106, 1110, and 1112 are respectively connected to through conductors 1114, 1115, 1116, and 1117.

A die 1120, an active component, is bonded to the package substrate 1102 by an adhesive 1122. The die 1120 is connected by bond wires 1124 to the through conductor 1114 and by bond wires 1126 to the through conductor 1116.

A passive component 1130 can be optionally bonded to the top of the die 1120 by an adhesive 1132. The passive component 1130 is connected to the die 1120 by bond wires 1134 and 1136.

A semi-C-shape integrated circuit die 1140 is the same as the semi-C-shape integrated circuit die 208 of FIG. 2D but is bonded to the top of the die 1120 at a first pedestal portion 1141 by an adhesive 1142 and to the package substrate 1102 at a longer second pedestal portion 1143 by an adhesive 1144. The semi-C-shape integrated circuit die 1140 is connected to the die 1120 by bond wires 1146 and is connected to the through conductor 1117 by bond wires 1148. The recess 1147 of the semi-C-shape integrated circuit die 1140 is sufficiently deep to clear the bond wires 1126 of the die 1120. The recess 1147 further has bevels at each end.

In the embodiment shown, the bond wires 1136 may be connected to the bond wires 1146 using an interposer 1138.

A mold compound 1150 is then formed around the various components to encapsulate the various components on the package substrate 1102.

Referring now to FIG. 12, therein is shown a cross-sectional view of a semi-C-shape integrated circuit die package 1200 with passive and active components using wire and solder bonds. The semi-C-shape integrated circuit die package 1200 includes a package substrate 1202 having solder balls 1204 through 1212 connected to various through conductors. The solder balls 1204, 1206, 1210, and 1212 are respectively connected to through conductors 1214, 1215, 1216, and 1217.

A die 1220 is bonded to the package substrate 1202 by an underfill material 1222 containing ball bumps 1223 connecting the die 1220 to electrical and heat transfer conductors on the package substrate 1202. The die 1220 is also connected by bond wires 1224 to the through conductors 1214 and by bond wires 1226 to the through conductors 1216.

A passive component 1230 can be optionally bonded to the top of the die 1220 by an adhesive 1232. The passive component 1230 can be optionally connected to the die 1220 by bond wires 1234.

A semi-C-shape integrated circuit die 1240 is the same as the semi-C-shape integrated circuit die 208 of FIG. 2D but is bonded to the top of the die 1220 at a first pedestal portion 1241 by an adhesive 1242 and to the package substrate 1202 at a longer second pedestal portion 1243 by an adhesive 1244. The semi-C-shape integrated circuit die 1240 can be optionally connected to the passive component 1230 by bond wires 1246 and is connected to the through conductors 1217 by bond wires 1248. The recess 1247 of the semi-C-shape integrated circuit die 1240 is sufficiently deep to clear the bond wires 1226 of the die 1220 and has bevels at each end.

A mold compound 1250 is then formed around the various components to encapsulate the various components on the package substrate 1202.

Referring now to FIG. 13A, therein is shown a cross-sectional view of a four-pedestal-shape integrated circuit die package 1300 with an active component. The four-pedestal-shape integrated circuit die package 1300 includes a package substrate 1302 having solder balls 1304 through 1312 connected to various through conductors. The solder balls 1304, 1306, 1310, and 1312 are respectively connected to through conductors 1314, 1315, 1316, and 1317.

A die 1320 is bonded to the package substrate 1302 by an adhesive 1322. The die 1320 is connected by bond wires 1324 and by bond wires 1326 to through conductors (not shown) in the package substrate 1302.

A four-pedestal-shape integrated circuit die 1330 is the same as the four-pedestal-shape integrated circuit die 408 of FIG. 4D but is bonded at four pedestals 1331 by an adhesive 1332 to the package substrate 1302. Bond wires 1334 and 1336 connect the four-pedestal-shape integrated circuit die 1330 to the through conductors 1314 and to the through conductors 1317, respectively. The recess 1337 of the four-pedestal-shape integrated circuit die 1320 is sufficiently deep to clear the bond wires 1324 and 1326, and may have square or angled corners as shown in FIG. 13A. An optional conductive material 1338 is placed between the die 1320 and the four-pedestal-shape integrated circuit die 1330 for improved heat conduction therebetween.

A mold compound 1340 is then formed around the various components to encapsulate the various components on the package substrate 1302.

Referring now to FIG. 13B, therein is shown a horizontal cross-sectional view of the structure of FIG. 13A taken along line 13B-13B. The bond wires 1324 and 1326 also extend between the four pedestals 1331 to allow the die 1320 to fit closely into the recess 1337 between the four pedestals 1331 to form a compact stack.

It will be understood that the C-shape integrated circuit die 308 of FIG. 3D would have the same cross-section as shown in FIG. 13A except that an active die underneath would have to be smaller to accommodate bond wires or would have to have bond balls to the through conductors.

Referring now to FIG. 14, therein is shown a cross-sectional view of an E-shape integrated circuit die package 1400 with an active component using wire bonding. The E-shape integrated circuit die package 1400 includes a package substrate 1402 having solder balls 1404 through 1412 connected to various through conductors. The solder balls 1404, 1406, 1410, and 1412 are respectively connected to through conductors 1414, 1415, 1416, and 1417.

A die 1420 is bonded to the package substrate 1402 by an adhesive 1422. The die 1420 is connected by bond wires 1424 to the through conductors 1415 and by bond wires 1426 to the through conductors 1416.

An E-shape integrated circuit die 1430 is the same as the E-shape integrated circuit die 508 of FIG. 5D but is bonded to the package substrate 1402 at first and third pedestal portions 1431 and 1433 by respective adhesives 1432 and 1434 and to the top of the die 1420 at a shorter, center, third pedestal portion 1435 by an adhesive 1436. Bond wires 1438 and 1439 connect the E-shape integrated circuit die 1430 to the through conductors 1414 and 1417, respectively. The recessed areas 1437 of the E-shape integrated circuit die 1430 are sufficiently deep to clear the bond wires 1424 and 1426 and may have square or angled corners as shown in FIG. 14.

A mold compound 1440 is then formed around the various components to encapsulate the various components on the package substrate 1402.

Referring now to FIG. 15, therein is shown a cross-sectional view of a multiple stack, E-shape integrated circuit die package 1500 with an active component using wire bonding. The E-shape integrated circuit die package 1500 includes a package substrate 1502 having solder balls 1504 through 1512 connected to various through conductors. The solder balls 1504, 1506, 1510, and 1512 are respectively connected to through conductors 1514, 1515, 1516, and 1517.

A first die 1520 is bonded to the package substrate 1502 by an underfill material 1522. The underfill material 1522 contains a number of solder bumps 1524 connecting the first die 1520 to various through conductors.

An E-shape integrated circuit die 1530 is the same as the E-shape integrated circuit die 508 of FIG. 5D but is bonded to the package substrate 1502 at its outer pedestal portions 1531 and 1533 by respective adhesives 1532 and 1534 and to the top of the die 1520 at its center pedestal portion 1535 by an adhesive 1536. Bond wires 1538 and 1539 connect the E-shape integrated circuit die 1530 to the through conductors 1514 and 1517, respectively.

A second die 1540 is bonded to the top of the E-shape integrated circuit die 1530 by an underfill material 1542. The underfill material 1542 contains a number of solder bumps 1544 connecting the second die 1540 to the E-shape integrated circuit die 1530 to provide a multiple die stack.

The solder bump connection 1524 would permit a larger first die 1520 in the recess 1537.

A mold compound 1550 is then formed around the various components to encapsulate the various components on the package substrate 1502.

Referring now to FIG. 16, therein is shown a cross-sectional view of a stacked T-shape integrated circuit die package 1600 with active components using solder bonding. The stacked T-shape integrated circuit die package 1600 includes a package substrate 1602 having solder balls 1604 through 1612 connected to various through conductors. The solder balls 1604, 1606, 1607, 1609, 1610, and 1612 are respectively connected to through conductors 1614, 1615, 1616, 1617, 1618, and 1619.

First and second dies 1620 and 1630 are bonded to the package substrate 1602 by respective underfill materials 1622 and 1632. The respective underfill materials 1622 and 1632 contain respective solder bumps 1624 and 1634 which connect the first and second dies 1620 and 1630 to various through conductors in the package substrate 1602.

A T-shape integrated circuit die 1640 is the same as the T-shape integrated circuit die 608 of FIG. 6D but is bonded to the package substrate 1602 by an adhesive 1642 at its center pedestal portion 1643 and to the tops of the first and second dies 1620 and 1630 by adhesives 1644 and 1645 at its outer recessed areas. Bond wires 1648 and 1649 connect the T-shape integrated circuit die 1640 to the through conductors 1614 and 1619, respectively.

A mold compound 1650 is then formed around the various components to encapsulate the various components on the package substrate 1602.

Figure 17:
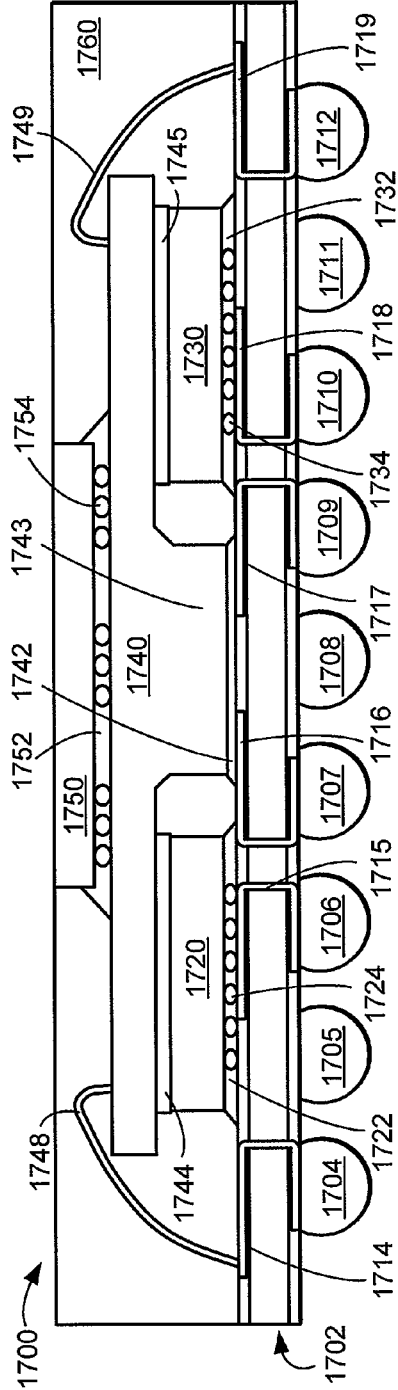
FIG. 17 is a cross-sectional view of a multiple stacked T-shape integrated circuit die package with multiple active components using solder bonding.

Referring now to FIG. 17, therein is shown a cross-sectional view of a stacked T-shape integrated circuit die package 1700 with active components using solder bonding. The stacked T-shape integrated circuit die package 1700 includes a package substrate 1702 having solder balls 1704 through 1712 connected to various through conductors. The solder balls 1704, 1706, 1707, 1709, 1710, and 1712 are respectively connected to through conductors 1714, 1715, 1716, 1717, 1718, and 1719.

First and second dies 1720 and 1730 are bonded to the package substrate 1702 by respective underfill materials 1722 and 1732. The respective underfill materials 1722 and 1732 contain respective solder balls 1724 and 1734 which connect the first and second dies 1720 and 1730 to various through conductors in the package substrate 1702.

A T-shape integrated circuit die 1740 is the same as the T-shape integrated circuit die 608 of FIG. 6D but is bonded to the package substrate 1702 by an adhesive 1742 at its center pedestal portion 1743 and to the tops of the first and second dies 1720 and 1730 by adhesives 1744 and 1745 at its outer recessed areas. Bond wires 1748 and 1749 connect the T-shape integrated circuit die 1740 to the through conductors 1714 and 1719, respectively.

A third die 1750 is bonded to the top of the T-shape integrated circuit die 1740 by an underfill material 1752. The adhesive 1752 contains a number of solder balls 1754 connecting the third die 1750 to the T-shape integrated circuit die 1740 to provide a multiple die stack.

A mold compound 1760 is then formed around the various components to encapsulate the various components on the package substrate 1702.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

The invention claimed is:

1. An integrated circuit die comprising:
   a body portion having a singulation side; and
   a pedestal portion extending from the body portion and having a singulation side coplanar with the singulation side of the body portion.

2. The integrated circuit die as claimed in claim 1 wherein the body portion and the pedestal portion combined provide a L-shape cross-section, a C-shape cross-section, a semi-C-shape cross-section, an E-shape cross-section, or a T-shape cross-section, the cross-section parallel with the singulation side of the body portion.

3. The integrated circuit die as claimed in claim 1 wherein the body portion and the pedestal portion combined provide a C-shape cross-section or a rectangular-shape cross-section perpendicular to the singulation side of the body portion.

4. The integrated circuit die as claimed in claim 1 further comprising a plurality of pedestal portions at the corners of the body portion.

5. The integrated circuit die as claimed in claim 1 further comprising:
   a package substrate having a through conductor, the package substrate having the pedestal portion attached thereto; and
   a bond connection between the body portion and the through conductor.

6. The integrated circuit die as claimed in claim 1 further comprising:
   a package substrate having a through conductor, the package substrate having the pedestal portion attached thereto;
   a die at least partially located under the body portion; and
   bond connections among the through conductor, the body portion, and the die.

7. The integrated circuit die as claimed in claim 1 further comprising:
   a package substrate having a through conductor, the package substrate having the pedestal portion attached thereto;
   a passive component on the package substrate; and
   bond connections among the through conductor, the passive component, and the body portion.

8. The integrated circuit die as claimed in claim 1 further comprising:
   a package substrate having through conductors, the package substrate having the pedestal portion attached thereto;
   a plurality of die at least partially located under the body portion; and
   bond connections among the through conductors and the plurality of die.

9. The integrated circuit die as claimed in claim 1 further comprising a die at least partially located under the body portion and having a bond connection thereto.

10. The integrated circuit die as claimed in claim 1 further comprising a die at least partially located over the body portion and having a bond connection thereto.

11. An integrated circuit die comprising:
    a body portion having a singulation side;
    an integrated circuit on the body portion; and
    a pedestal portion integral with and extending down from the body portion, the pedestal portion having a singulation side coplanar with the singulation side of the body portion.

12. The integrated circuit die as claimed in claim 11 wherein the body portion and the pedestal portion combined provide a L-shape cross-section, a C-shape cross-section, a semi-C-shape cross-section, an E-shape cross-section, or a T-shape cross-section parallel with the singulation sides of the body portion, the cross-section provided with a square or angled corner.

13. The integrated circuit die as claimed in claim 11 wherein the body portion and the pedestal portion combined provide a C-shape cross-section or a rectangular-shape cross-section perpendicular to the singulation sides of the body portion and the pedestal portion, the cross-section provided with a square or angled corner.

14. The integrated circuit die as claimed in claim 11 further comprising a plurality of additional pedestal portions extending from the body portion to define a four-pedestal-shape integrated circuit die.

15. The integrated circuit die as claimed in claim 11 further comprising:
    a package substrate having a through conductor, the package substrate having the pedestal portion attached thereto wherein the body portion and the pedestal portion combined provide a L-shape cross-section, a C-shape cross-section, a semi-C-shape cross-section, an E-shape cross-section, or a T-shape cross-section parallel with the singulation sides of the body portion and the pedestal portion;
    a die at least partially located under the body portion and attached to the package substrate;
    a shorter pedestal portion extending from the body portion and shorter than the pedestal portion, the shorter pedestal portion attached to the die; and
    a bond connection between the body portion and the through conductor.

16. The integrated circuit die as claimed in claim 11 further comprising:
- a package substrate having a through conductor, the package substrate having the pedestal portion attached thereto wherein the body portion and the pedestal portion combined provide a L-shape cross-section, a C-shape cross-section, a semi-C-shape cross-section, an E-shape cross-section, or a T-shape cross-section parallel with the singulation sides of the body portion and the pedestal portion;
- a die at least partially located under the body portion and attached to the package substrate and the body portion; and
- bond connections among the through conductor, the body portion, and the die.

17. The integrated circuit die as claimed in claim 11 further comprising:
- a package substrate having a through conductor, the package substrate having the pedestal portion attached thereto wherein the body portion and the pedestal portion combined provide a L-shape cross-section, a C-shape cross-section, a semi-C-shape cross-section, an E-shape cross-section, or a T-shape cross-section parallel with the singulation sides of the body portion and the pedestal portion;
- a die on the package substrate and attached to the body portion;
- a passive component on the die; and
- bond connections among the through conductor, the passive component, and the body portion.

18. The integrated circuit die as claimed in claim 11 further comprising:
- a package substrate having through conductors, the package substrate having the pedestal portion attached thereto wherein the body portion and the pedestal portion combined provide a T-shape cross-section parallel with the singulation sides of the body portion and the pedestal portion;
- a plurality of dies located under the body portion; and
- bond connections among the through conductors and the plurality of die.

19. The integated circuit die as claimed in claim 11 further comprising:
- a package substrate having the pedestal portion attached thereto;
- a plurality of additional pedestal portions extending from the body portion to define a four-pedestal-shape integrated circuit die;
- a die located under the body portion and within the plurality of pedestals; and
- bond connections among the die, the package substrate, and the body portion.

20. The integrated circuit die as claimed in claim 11 further comprising a die at least partially located over the body portion and having a bond connection thereto.

* * * * *

UNITED STATES PATENT AND TRADEMARK OFFICE
CERTIFICATE OF CORRECTION

PATENT NO. : 7,786,593 B2
APPLICATION NO. : 11/760690
DATED : August 31, 2010
INVENTOR(S) : Ararao et al.

It is certified that error appears in the above-identified patent and that said Letters Patent is hereby corrected as shown below:

Column 16:
Claim 19, line 14, delete "The integated" and insert therefore --The integrated--

Signed and Sealed this

Twenty-third Day of November, 2010

David J. Kappos
*Director of the United States Patent and Trademark Office*